United States Patent [19]

Nagata

[11] Patent Number: 5,082,801
[45] Date of Patent: Jan. 21, 1992

[54] PROCESS FOR PRODUCING MULTILAYER INTERCONNECTION FOR SEMICONDUCTOR DEVICE WITH INTERLAYER MECHANICAL STRESS PREVENTION AND INSULATING LAYERS

[75] Inventor: Shunichi Nagata, Kawasaki, Japan

[73] Assignee: Fujitsu Limited, Kawasaki, Japan

[21] Appl. No.: 488,928

[22] Filed: Mar. 6, 1990

[30] Foreign Application Priority Data

Mar. 10, 1989 [JP] Japan .................................. 1-058148

[51] Int. Cl.$^5$ ............................................ H01L 21/44
[52] U.S. Cl. ..................................... 437/190; 437/195; 437/197; 437/199
[58] Field of Search ................ 437/190, 195, 197, 199

[56] References Cited

U.S. PATENT DOCUMENTS

| | | | |
|---|---|---|---|
| 3,922,184 | 11/1975 | Baker et al. | 437/228 |
| 4,381,595 | 5/1983 | Denda et al. | 437/195 |
| 4,782,380 | 11/1988 | Shankar et al. | 437/190 |
| 4,879,254 | 11/1989 | Tsuzuki et al. | 437/984 |
| 4,897,709 | 1/1990 | Yokoyama et al. | 437/190 |
| 4,920,071 | 4/1990 | Thomas | 437/190 |
| 4,962,414 | 10/1990 | Liou et al. | 437/189 |

FOREIGN PATENT DOCUMENTS

| | | | |
|---|---|---|---|
| 8928 | 3/1980 | European Pat. Off. | 437/203 |
| 6017040 | 2/1981 | Japan | 437/195 |
| 57-40956 | 3/1982 | Japan | 437/195 |
| 57-170550 | 10/1982 | Japan | 437/195 |
| 60-37145 | 2/1985 | Japan . | |
| 62-47122 | 2/1987 | Japan | 437/195 |
| 62-78854 | 4/1987 | Japan . | |
| 1-12551 | 1/1989 | Japan | 437/195 |
| 1-69031 | 3/1989 | Japan | 437/195 |
| 1-255250 | 10/1989 | Japan . | |

Primary Examiner—Olik Chaudhuri
Assistant Examiner—G. Fourson
Attorney, Agent, or Firm—Armstrong, Nikaido, Marmelstein, Kubovcik & Murray

[57] ABSTRACT

The present invention is directed to a process for producing a semiconductor device that has a multilayer interconnection composed of a plurality of conductive layers electrically separated from each other by interlayer insulating layers inserted therebetween in an area other than the sites at which the conductive layers are electrically interconnected via a through hole. At least one of the conductive layers has a layer formed thereon for preventing stress- and/or electro-migration thereof. The process comprises the steps of forming a first conductive layer; forming on the first conductive layer a layer for preventing stress- and/or electro-migration of the conductive layer; forming an opening through the entire thickness of the migration-preventing layer that has a diameter less than the width of the conductive layer, so as to expose a surface of the conductive layer within the region surrounded by the periphery of the opening; forming an interlayer insulating layer on the migration-preventing layer and the exposed surface of the conductive layer so as to cover the migration-preventing layer and the underlying conductive layer and to fill the opening; forming a through hole having a diameter less than that of the opening and extending through the entire thickness of the interlayer insulating layer to the surface of the conductive layer within the region of the filled opening so that the surface of the conductive layer is exposed but the periphery of the opening is not exposed; and forming a second conductive layer on the interlayer insulating layer so that, during the forming of the second conductive layer, the through hole is filled with the conductive substance of said second conductive layer to thereby electrically connect the first and the second conductive layers.

10 Claims, 4 Drawing Sheets

PROCESS FOR PRODUCING MULTILAYER INTERCONNECTION FOR SEMICONDUCTOR DEVICE WITH INTERLAYER MECHANICAL STRESS PREVENTION AND INSULATING LAYERS

BACKGROUND OF THE INVENTION

1. Field of the Invention

The present invention relates to a process for producing a semiconductor device having a multilayer interconnection composed of a plurality of conductive layers electrically separated from each other in an area other than the sites at which conductive layers are electrically interconnected via a through hole.

2. Description of the Related Art

Most semiconductor devices have a layer such as a TiN (titanium nitride) film formed on a conductive layer, such as an Al(aluminum)-interconnection, to prevent stress- and/or electro-migration of the conductive layer. In a semiconductor device having a multilayer interconnection composed of a plurality of conductive layers electrically separated from each other, the necessary interconnections between these conductive layers are effected through a through hole formed in an interlayer insulating layer inserted between and electrically separating the conductive layers.

Referring to FIG. 1, in a process for producing a semiconductor device on a semiconductor substrate 201 having an insulation substrate 202 formed thereon, a through hole is conventionally formed in the following manner: an Al conductive layer 20 and an overlying TiN layer 21 are uniformly covered with a $SiO_2$ (silicon oxide) hillock-preventing insulating layer 22; a flattening insulating layer 23 and a PSG (phosphosilicate glass) layer 24 are then formed, in that order (FIG. 1 (a)); and the $SiO_2$ and the PSG layers 22, 24 are patterned by a photoetching method using a photoresist 25, to open a through hole 26 (FIG. 1 (b)).

A fluorine-based gas is usually used as an etchant to form the through hole 26 and, during the etching, the TiN layer 21 is also etched and the through hole 26 also extends through the TiN layer 21. TiN is etched by the fluorine-based gas at a relatively higher rate than the $SiO_2$ or PSG of the layers 22 or 24, and thus a sideways etching of the TiN layer 21 is excessive, with the result that the $SiO_2$ and the PSG layers 22, 24 overhang the TiN layer 21, i.e., a side groove 27 is formed between the TiN layer 21 and the $SiO_2$ layer 22, or the through hole 26 has a broadened bottom.

In a subsequent process step, when a conductive substance 28 is filled in the through hole 26 and a heat treatment is carried out, a residue possibly present within the side groove 27 is evaporated and diffused spread to an interface between the Al conductive layer 20 and the filled conductor 28, to cause a problem in that the contact resistance between these two conductors 20 and 28, and in turn two conductive layer, is undesirably increased.

SUMMARY OF THE INVENTION

Figure 1A:
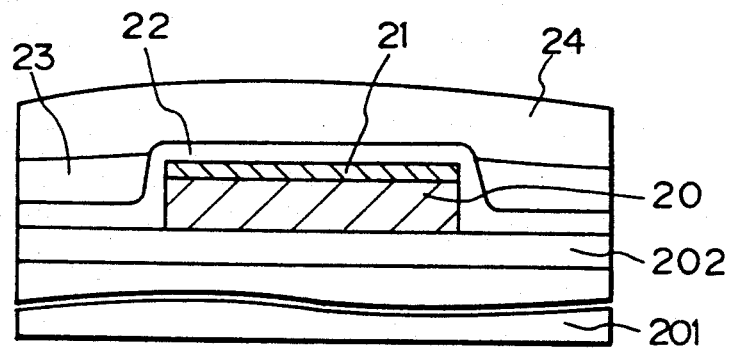
FIGS. 1 (a) and (b) are sectional views showing a conventional process sequence.

The object of the present invention is to provide a process for producing a semiconductor device having a multilayer interconnection, in which an interconnection between conductive layers composing the multilayer interconnection is ensured without an increase of the contact resistance.

To achieve the object according to the present invention, there is provided a process for producing a semiconductor device having a multilayer interconnection composed of a plurality of conductive layers electrically separated from each other by interlayer insulating layers inserted therebetween in an area other than the sites at which the conductive layers are electrically interconnected via a through hole, in which at least one of the conductive layers has a layer formed thereon for preventing stress- and/or electro-migration thereof, comprising the steps of:

forming a first conductive layer;

forming on a first conductive layer a layer for preventing stress- and electro-migration of the conductive layer;

forming an opening through the entire thickness of said migration-preventing layer, the opening having a diameter less than the width of the conductive layer, to expose a surface of the conductive layer within the region surrounded by the periphery of the opening;

forming an interlayer insulating layer on the migration-preventing layer and the exposed surface of the conductive layer to cover the migration-preventing layer and the underlying conductive layer and to fill the opening;

forming a through hole having a diameter less than that of the opening and extending through the entire thickness of the interlayer insulating layer to the surface of the conductive layer within the region of the filled opening so that the surface of the conductive layer is exposed but the periphery of the opening is not exposed; and forming a second conductive layer on the interlayer insulating layer so that, during the forming of the second conductive layer, the through hole is filled with the conductive substance of said second conductive layer, to electrically connect the first and the second conductive layers.

According to the present invention, since a through hole having a diameter less than that of an opening previously formed in a migration-preventing layer such as TiN film 21 is formed through the opening after the opening is filled with an insulating substance of an interlayer insulating layer in a manner such that the periphery of the opening is not exposed, the migration-preventing layer such as TiN film is therefore protected against etching using a flourine-based gas during the forming of the through hole. This protection eliminates the excessive sideways etching of the migration-preventing layer, i.e., the overhang of the interlayer insulating layer including an $SiO_2$ and a PSG insulation layers 22, 24 or the formation of a side groove 27.

The present invention thus prevents an accumulation of a residue, which would be otherwise retained in the through hole bottom, and eliminates any undesirable increase of the contact resistance to thereby ensure a good interconnection between the conductive layers.

DESCRIPTION OF THE PREFERRED EMBODIMENTS

FIGS. 2 (a) to 2 (i) are sectional vies showing a sequence of a process according to the present invention.

In FIG. 2 (a), a interconnection-patterned layer 1 has a predetermined pattern of a conductive interconnection of a semiconductor device and is composed of a 0.5 μm thick Al conductive layer 3 formed on a PSG (phosphosilicate glass) insulating substrate 2 on a semiconductor substrate or wafer 101 and a 500 Å thick TiN migration-preventing layer 4 formed by sputtering on the Al conductive layer 3. The migration-preventing layers usually used include the layers of silicides of refractory metals such as $MoSi_x$ (molybdenum silicide) and $TaSi_x$ (tantalum silicide) and nitrides of refractory metals such as TiN. Other silicides such as WSix (wolfram silicide) and $TiSi_x$ (titanium silicide) can be used. Intermetallic compounds of refractory metals such as TiW also may be used, although particular care must be taken to prevent a reaction between the TiW and Al of the conductive layers.

The interconnection between the Al conductive layer 3 and another not-shown conductive layer to be formed above the Al conductive layer 3 is realized in the following sequence.

A 1.5 μm thick photoresist layer 5 is applied on the insulating substrate 2 and the patterned layer 1 and subjected to exposure and development treatments to form a window 7 in the photoresist layer 5 and on the TiN migration-preventing layer 4. The window 7 has a diameter of 2.1 μm, which is smaller than the width 2.9 μm of the layer 1 or the layers 3 and 4 and greater than the diameter 1.3 μm of a through hole to be later formed (FIG. 2 (b)).

Then, using the photoresist layer 5 as a mask, the TiN migration-preventing layer 4 of the patterned layer 1 is subjected to an etching treatment using a gaseous mixture of $CHF_3$ and $CF_4$ as an etchant to form an opening 8 in the TiN migration-preventing layer 4, the opening 8 having substantially the same diameter (2.1 μm) as that of the window 7, i.e., a diameter smaller than the width of the patterned layer 1 or the layers 3 and 4 and greater than the diameter of a through hole to be later formed, and after the etching, the photoresist layer 5 is removed (FIG. 2 (c)). The non-etched, retained parts 41 and 42 of the TiN layer 4 have a width of 0.4 μm. A preferred etching condition is, for example, an etchant gas composition of 100 sccm $CHF_3$ and 100 sccm in terms of gas flow rate, a plasma power of 700 W, and a background pressure 0.3 Torr. An$SF_6$ gas also may be used as an etchant gas under a preferred etching condition of, for example, a flow rate of 200 sccm, a plasma power of 300 W, and a background pressure of 0.2 Torr. The latter $SF_6$ etching provides a faster etching rate than the former mixed gas etching.

A 3000 Å thick $SiO_2$ hillock-preventing insulating layer 9 is then formed on the substrate 2 and the layer 1 or the layers 3 and 4 by sputtering, or chemical vapor deposition with or without plasma, etc. (FIG. 2 (d)). Sputtering is preferred as a harder $SiO_2$ layer 9 is obtained thereby, and a harder layer 9 more effectively prevents the formation of hillock in the conductive layer 3. During the formation of the $SiO_2$ layer 9, the opening 8 is filled with the insulating substance of this layer 9.

A 4000 Å thick SOG (spin-on-glass) layer 10 is formed on the $SiO_2$ layer 9 by spin-coating and heating for setting-up as shown by a double-dotted line in FIG. 2 (e), and is then etched-back by a thickness of 2400 Å to flatten the vicinity of the interconnection-patterned layer 1 and improve the step-coverage (shown by a solid line in FIG. 2 (e)).

An insulating layer 11 such as PSG (phosphosilicate glass) or BPSG (borophosphosilicate glass) is then formed by chemical vapor deposition and a photoresist layer 12 is applied. The photoresist layer 12 is subjected to exposure and development treatments to form a window 13 having a diameter necessary for forming a through hole to be later formed (which diameter is smaller than that of the opening 8) above and within the region of the opening 8 (FIG. 2 (f)).

Then, using the photoresist layer 12 as a mask, the upper portion of the PSG layer 11 is isotropically etched by a plasma etching method using a gaseous mixture of $CF_4$ and $O_2$ as an etchant. This isotropic etching gives a funnel-shape etched portion (or the top portion of a through hole) as shown in FIG. 2 (g), which ensures an improved step-coverage during the forming of another conductive layer to be formed later on the PSG insulating layer 11 (to be later described with reference to FIG. 2 (i)). A preferred condition for the isotropic etching is, for example, a gas flow rate of 800 sccm $CF_4$ and 130 sccm $O_2$, and a plasma power of 1.0 kW, and a background pressure of 1.0 Torr. Wet etching using an HF solution containing ammonium flouride or a buffered HF solution also may be used for the isotropic etching when a relatively rough distribution of the etching rate is acceptable.

After the isotropic etching, using the photoresist layer 12 again as a mask, the remaining PSG layer 11 and $SiO_2$ layer 9 are unisotropically etched by a reactive ion etching method using a gaseous mixture of $CHF_3$ and $CF_4$ as an etchant, to complete a through hole 6 extending through the entire thickness of the interlayer insulating layers 9 and 11 to the surface of the Al conductive layer 3 within the region of the filled opening 8, so that the surface of the Al conductive layer within the region of the opening 8 is exposed but the periphery of the opening 8 is not exposed (FIG. 2 (h)). The non-etched, retained parts 91 and 92 of the $SiO_2$ insulating layer 9 inside the periphery of the opening 8 have a wall thickness of 0.4 μm. A preferred condition for the unisotropic etching is, for example, a gas flow rate of 100 sccm $CF_4$ and 100 sccm $CHF_3$, a plasma power of 700 W, and a background pressure of 0.3 Torr.

Figure 1B:
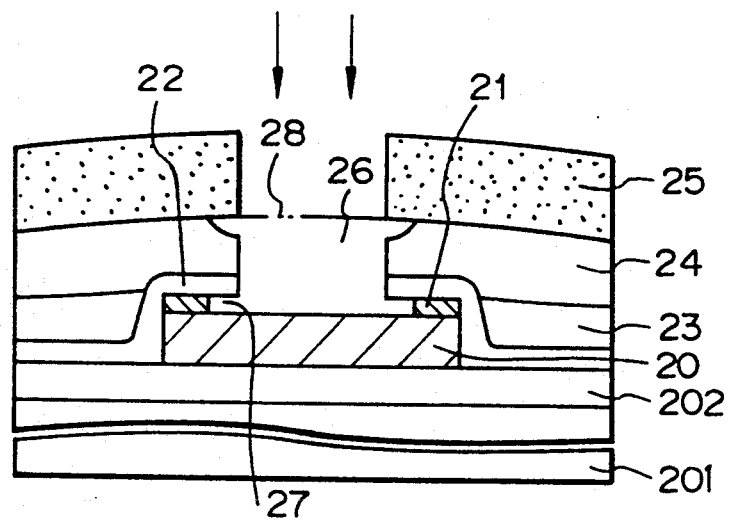
Figure 2A:
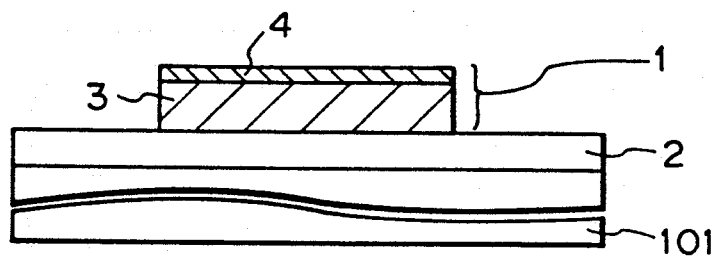
FIGS. 2 (a) to 2 (i) are sectional views showing a process sequence according to the present invention.
Figure 2B:
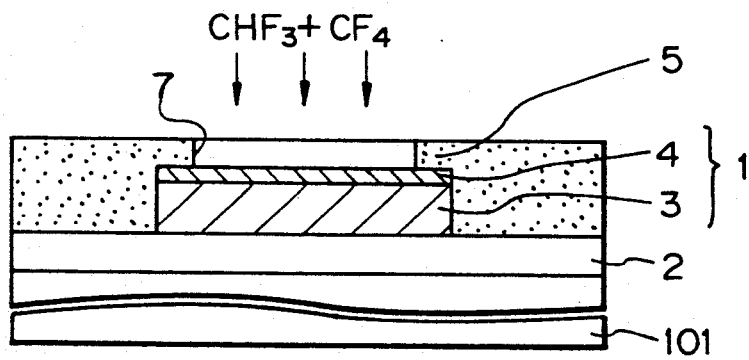
Figure 2C:
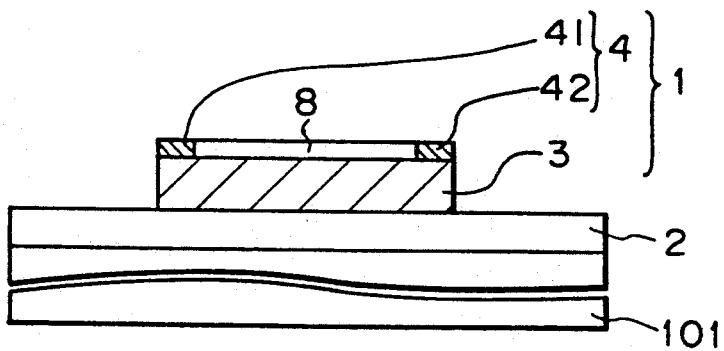
Figure 2D:
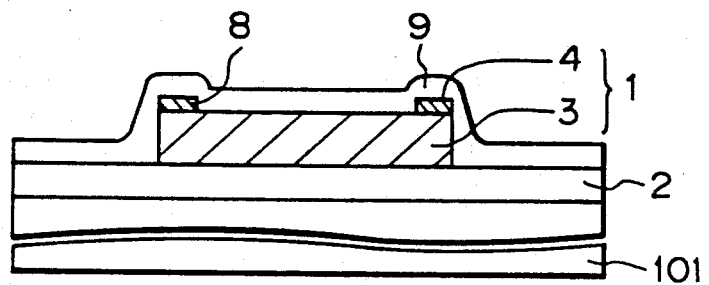
Figure 2E:
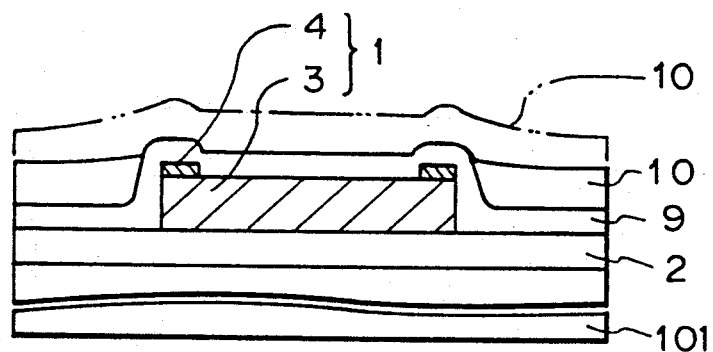
Figure 2F:
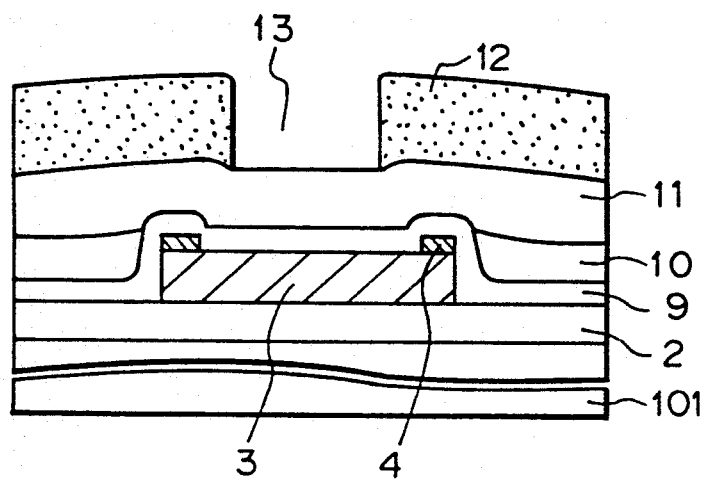
Figure 2G:
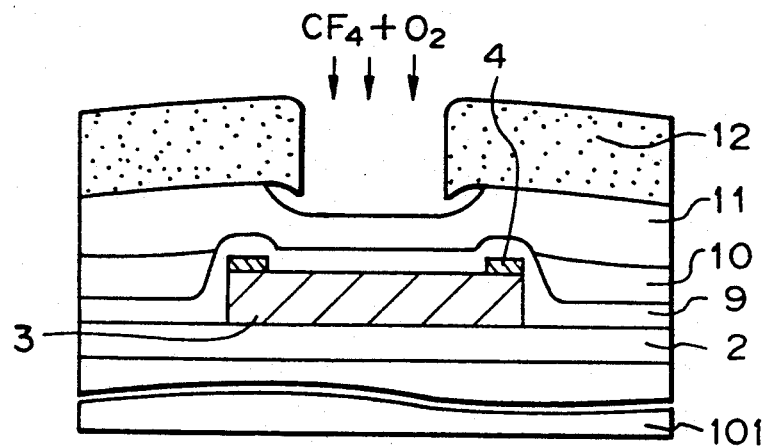
Figure 2H:
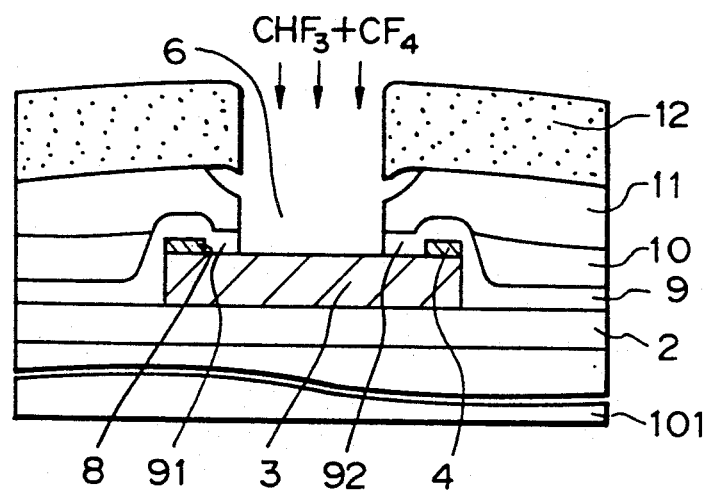
Figure 2I:
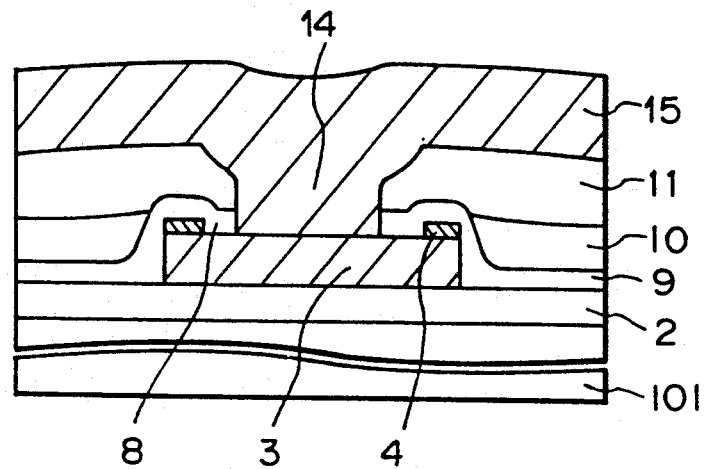

The through hole 6 having a diameter 1.3 μm, which is less than that of the opening 8 (2.1 μm) previously formed in the TiN migration-preventing layer 4, is formed through the opening 8 after the opening is filled with insulating substances PSG and $SiO_2$ of interlayer insulation layers 9 and 11 in a manner such that the periphery of the opening 8 is not exposed but covered by a 0.4 μm thick non-etched, retained wall of $SiO_2$ insulating layer 9, and therefore, the TiN migration-preventing layer 4 is protected against etching (reactive ion etching) using the flourine-based gas (a gaseous mixture of $CHF_3$ and $CF_4$) during the forming of the through hole 6. This protection eliminates the excessive sidewise etch of the TiN migration-preventing layer 4, i.e., the overhang of the $SiO_2$ and the PSG interlayer insulating layers 9 and 11 or the formation of a side groove 27, which was conventionally unavoidable as shown in FIG. 1 (b).

A preferred ratio of the isotropic/unisotropic etching depths is about 6:4.

Another conductive layer 15 having a thickness of 1.0 μm is then formed on the interlayer insulating layer 11 so that, during the forming of this layer 15, the through hole 6 is filled with the conductive substance 14 of the conductive layer 15 to electrically connect two conductive layers 3 and 15 (FIG. 2 (*i*)).

A good interconnection between the conductive layers 3 and 15 is ensured, since sites of a possible residue such as the conventional side groove 27 are eliminated and any residue present in the bottom of the through hole can be easily removed.

Experiments showed that, in the through holes formed in the above-mentioned process according to the present invention, the occurrence of voids due to such side grooves was decreased to less than one third of that occurring during the conventional through holes forming process.

Note, although a process for producing a semiconductor device having an Al conductive layer is described, the present inventive process also may be applied to semiconductor devices having conductive layers of other alloys such as Al-1%Si-0.1%Cu alloy, Al-0.5%Ti-0.1%Cu alloy, etc. having a higher mechanical strength than unalloyed or pure Al metal.

I claim:

1. A process for producing a semiconductor device having a multilayer interconnection composed of a plurality of conductive layers electrically separated from each other by interlayer insulating layers inserted therebetween in an area other than sites at which the conductive layers are electrically interconnected via a through hole, at least one of the conductive layers having a layer formed thereon for preventing stress- and/or electro-migration thereof, the process comprising the steps of:

forming a first conductive layer;
   forming on said first conductive layer a migration-preventing layer for preventing mechanical stress- and/or electro-migration in said first conductive layer;
   forming an opening through said migration-preventing layer, the opening having a width less than a width of said first conductive layer within a region surrounded by a periphery of the opening;
   forming an interlayer insulating layer on said migration-preventing layer and the exposed surface of said first conductive layer so as to cover said migration-preventing layer and said first conductive layer, and to fill the opening;
   forming a through hole having a width less than the width of the opening and extending through said interlayer insulating layer to the surface of said first conductive layer within the region of the filled opening so that the surface of said first conductive layer is exposed while not exposing a periphery of the opening; and
   forming a second conductive layer on said interlayer insulating layer so that, during the forming of said second conductive layer, the through hole is filled with a conductive substance of said second conductive layer to thereby electrically connect said first and the second conductive layers.

2. A process according to claim 1, wherein said forming of a through hole is carried out by an etching, the process further comprising the following two steps:
   isotropically etching an upper portion of said interlayer insulating layer from a free surface thereof;
   anisotropically etching a remainder of said interlayer insulating layer until the through hole is completed to expose the surface of said first conductive layer.

3. A process according to claim 2, wherein said isotropic etching is carried out by a dry etching.

4. A process according to any one of claim 1 to 3, wherein said migration-preventing layer comprises a layer substantially composed of TiN.

5. A process according to claim 4, wherein said TiN migration-preventing layer is subjected to an etching treatment using a gaseous mixture of $CHF_3$ and $CF_4$ as an etchant to form the opening.

6. A process according to claim 2, wherein forming said interlayer insulating layer includes forming a hillock-preventing layer for preventing formation of hillocks in said first conductive layer and a phosphosilicate glass or a borophosphosilicate glass layer.

7. A process according to claim 6, wherein said hillock-preventing layer consists of $SiO_2$.

8. A process according to claim 6, wherein said isotropic etching of the upper portion of said interlayer insulating layer is carried out by a plasma etching method using a first gaseous mixture comprising fluoromethane and/or fluoroethane as an etchant and said anisotropic etching of the remainder of said interlayer insulation layer is carried out by a reactive ion etching method using a second gaseous mixture comprising fluoromethane and/or fluoroethane as an etchant.

9. A process according to claim 8, wherein said first gaseous mixture further comprises oxygen.

10. A process according to any one of claims 1 to 3, wherein said first and/or second conductive layers are composed of any material selected from the group consisting of Al and an aluminum-based alloy containing at least one alloying element selected from the group consisting of silicon, copper, titanium and tungsten.

* * * * *